(12) United States Patent
Chan et al.

(10) Patent No.: US 7,484,899 B2
(45) Date of Patent: Feb. 3, 2009

(54) SMALL-FORM-FACTOR FIBER OPTIC TRANSCEIVER MODULE HAVING BUILT-IN TEST CAPABILITY AND METHOD

(75) Inventors: Eric Y Chan, Mercer Island, WA (US); Dennis G Koshinz, Bellevue, WA (US); Yuing Huang, Bellevue, WA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 11/555,354

(22) Filed: Nov. 1, 2006

(65) Prior Publication Data

US 2008/0101752 A1    May 1, 2008

(51) Int. Cl.
G02B 6/36    (2006.01)
(52) U.S. Cl. ............................. 385/89; 385/31; 385/43; 385/88; 385/92
(58) Field of Classification Search ........................ None
See application file for complete search history.

(56) References Cited

U.S. PATENT DOCUMENTS

| | | | |
|---|---|---|---|
| 4,165,496 A * | 8/1979 | Di Domenico et al. | 372/31 |
| 4,197,007 A * | 4/1980 | Costa et al. | 356/73.1 |
| 5,071,213 A | 12/1991 | Chan | |
| 5,416,869 A | 5/1995 | Yoshino | |
| 5,841,562 A * | 11/1998 | Rangwala et al. | 398/139 |
| 5,896,481 A | 4/1999 | Chan et al. | |
| 6,704,515 B1 | 3/2004 | Chan et al. | |
| 6,873,780 B2 | 3/2005 | Chan et al. | |
| 7,018,110 B2 | 3/2006 | Kuhara et al. | |
| 7,031,574 B2 * | 4/2006 | Huang et al. | 385/39 |

(Continued)

FOREIGN PATENT DOCUMENTS

CA    1154299 A    5/2001

(Continued)

OTHER PUBLICATIONS

U.S. Appl. No. 11/093,685, filed Mar. 30, 2005, Eric Chan et al., "Technique for Implementation of Built-in-test (BIT) for Mil Spec Fiber Optic Transceiver Modules".

(Continued)

*Primary Examiner*—Sung H Pak
*Assistant Examiner*—Chad H Smith
(74) *Attorney, Agent, or Firm*—Evan Law Group LLC

(57) ABSTRACT

A fiber optic transceiver module having built-in test capability is packaged in a housing to meet small-form-factor (SFF) requirements. The module has a first optical fiber having an angled end that defines an acute angle relative to a longitudinal axis of the first optical fiber. A second optical fiber also has an angled end that defines an acute angle relative to the longitudinal axis of the second optical fiber. The first optical fiber and the second optical fiber are aligned with one another. An optical source emits an optical signal propagated along the first optical fiber in which a portion of the optical signal is received at the second optical fiber and is propagated along the second optical fiber. An optical detector receives a return optical signal transmitted through the angled end of the second optical fiber in response to reflection from a discontinuity in the optical path of the second optical fiber.

46 Claims, 3 Drawing Sheets

U.S. PATENT DOCUMENTS

| | | | |
|---|---|---|---|
| 7,171,081 B1 * | 1/2007 | Ko et al. ...................... 385/39 |
| 7,341,384 B2 | 3/2008 | Chan et al. |
| 2003/0091301 A1 * | 5/2003 | Lee et al. ...................... 385/89 |
| 2003/0095746 A1 * | 5/2003 | Williamson .................. 385/33 |
| 2003/0103716 A1 * | 6/2003 | Capik et al. ................... 385/17 |
| 2003/0123819 A1 * | 7/2003 | Nakanishi et al. ............. 385/92 |
| 2004/0135992 A1 * | 7/2004 | Munro ...................... 356/4.01 |
| 2005/0129367 A1 | 6/2005 | Chan et al. |
| 2007/0036493 A1 * | 2/2007 | Brenner et al. ................ 385/89 |

FOREIGN PATENT DOCUMENTS

| | | |
|---|---|---|
| GB | 2020447 A | 11/1979 |
| JP | 1008880 A | 6/2000 |

OTHER PUBLICATIONS

Chan, et al., "Demonstration of a GB/S Transceiver with OTDR Built-in-Test for Avionics Local Area Networks", The Institution of Electrical Engineers, Stevenage, GB, Online Database inspection, Oct. 19, 2006, pp. 5A3-1-5A3-4.

* cited by examiner

SMALL-FORM-FACTOR FIBER OPTIC TRANSCEIVER MODULE HAVING BUILT-IN TEST CAPABILITY AND METHOD

STATEMENT OF GOVERNMENT RIGHTS

This invention was made with Government support under contract number N00019-04-0005 awarded by the United States Navy. The government has certain rights in this invention.

FIELD OF THE INVENTION

The present invention relates generally to fiber optic transceiver modules, and more particularly, to small-form-factor (SFF) fiber optic transceiver modules having built-in test capability.

BACKGROUND OF THE INVENTION

Newer generations of aircraft and other air and space vehicles, including military aircraft, are increasingly using fiber optic connections, rather than metallic wiring, for communications, weaponry, and other systems. Optical fiber connections provide faster communication speed, increased bandwidths, EMI isolation and light weight. However, optical fiber can be more fragile than metallic wiring and can be damaged during installation, during the rigors of flight testing or during flight operation.

Damage to optical fiber can be difficult to distinguish from faults occurring in other components of the aircraft systems. Even when it is known that the damage exists, it can be difficult to identify the precise location of the damage. These difficulties can increase the maintenance costs and reduce the operating efficiency of the aircraft.

One solution to decrease the maintenance costs of any complex system that uses fiber optic connections is to implement built-in test (BIT) capability. BIT capability may be incorporated directly into the fiber optic transceiver module that is otherwise responsible for transmitting and receiving signals via the optical fibers in the cable plant of an airplane. Transceivers with BIT capability may also be employed in local area networks in the telecommunication industry where fibers are buried underground or installed inside tight building space. With BIT capability in a transceiver module, the optical fiber can be routinely tested for any discontinuities in the optical fiber that are indicative of damage. For example, the optical fiber can be tested for breaks and contamination every time the system is started. A transceiver having BIT capabilities identifies the precise location of the fiber damage, thereby avoiding costly maintenance and repairs where the entire fiber network needs to be checked with bulky and expensive equipment operated by expensive, highly skilled personnel.

Hardware installed on certain aircraft (such as military aircraft) must meet certain specification requirements. For instance, small-form-factor (SFF) specifications may be required for certain fiber optic transceiver modules in an aircraft. SFF specifications for a transceiver are design standards resulting from a multi-source agreement (MSA) developed by major commercial fiber optic transceiver suppliers. Certain military and aerospace platforms are installed with SFF transceivers but without BIT capabilities. As a result, such conventional fiber optic systems using SFF transceivers without BIT capabilities require expensive maintenance and repair costs when fiber damage occurs in the cable plant. It is therefore highly desirable to have a fiber optic transceiver module that meets SFF requirements and also has built-in test capability.

SUMMARY

A fiber optic transceiver module having built-in test capability is packaged in a housing to meet small-form-factor (SFF) requirements. A first optical fiber is provided having an angled end that defines an acute angle relative to a longitudinal axis of the first optical fiber. A second optical fiber also has an angled end that defines an acute angle relative to the longitudinal axis of the second optical fiber. The first optical fiber and the second optical fiber are aligned with one another. An optical source emits an optical signal propagated along the first optical fiber in which a portion of the optical signal is received at the second optical fiber and is propagated along the second optical fiber. An optical detector receives a return optical signal transmitted through the angled end of the second optical fiber in response to reflection from a discontinuity in the optical path of the second optical fiber.

DETAILED DESCRIPTION

A fiber optic transceiver module having built-in test capabilities (BIT), and associated method for detecting discontinuities (such as breaks) in the optical fiber that are connected to the transceiver module are provided. An optical source emits an optical signal that is reflected by an angled end of the optical fiber. A portion of the optical signal is received at a second optical fiber and is propagated along the second optical fiber. The second optical fiber has an angled end that is aligned with the angled end of the first optical fiber. If the portion of optical signal propagating along the second optical fiber encounters a discontinuity in the optical path of the second optical fiber, at least a portion of this optical signal is reflected along the second optical fiber back towards the angled end. When the reflected return optical signal reaches the angled end of the second optical fiber, some portion of the reflected return signal is reflected and passed through the angled end and is received by an optical detector. By analyzing the time that has elapsed from the emission of the optical signal by the optical source to the reflected return optical signal pulse detected by the optical detector, the existence and location of the discontinuity may be determined. The use of angled ends in the optical fibers enables the fiber optic transceiver module to achieve BIT functionality while meeting SFF requirements without using bulky optical components to split the optical signals, such as prisms and lenses.

In particular, a SFF fiber optic transceiver module having BIT capabilities employs a pair of fiber optic cables having their respective ends held and aligned, in a groove of a silicon coupler. A first optical fiber has an angled end that defines an acute angle relative to a longitudinal axis of the first optical fiber. The second optical fiber also has an angled end that defines an acute angle relative to a longitudinal axis of the second optical fiber. The angled ends of the first and second optical fibers are matingly aligned with one another. The acute angle for both the angled ends of the first and second optical fibers, may, for example, both be between 40 degrees and 60 degrees. In one example, the acute angle for both the first and the second optical fibers is 49 degrees. An optical source emits an optical signal that is propagated along the first optical fiber. The optical signal is split at the angled end of the first optical fiber such that a portion of the optical signal is received at the second optical fiber and is propagated along the second optical fiber. An optical detector receives a return optical signal through the angled end of the second optical fiber in response to reflection from a discontinuity in the second optical fiber and the fiber segments that are connected to it.

Figure 1:
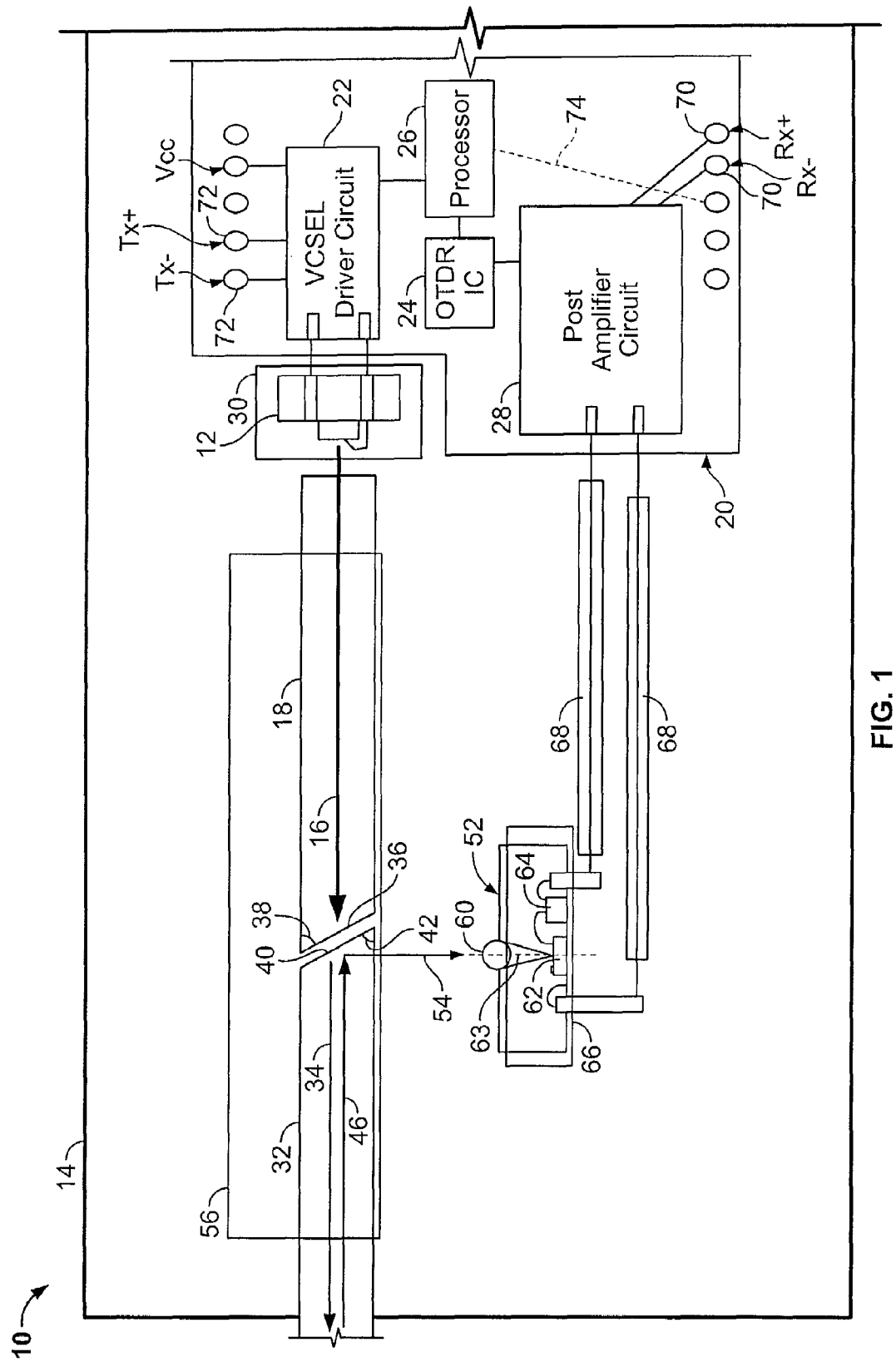
FIG. 1 is a system diagram illustrating an example of a small-form-factor (SFF) fiber optic transceiver module having BIT capabilities with a single input/output (I/O) fiber.

Referring to FIG. 1, fiber optic transceiver module 10 is shown. In this example, fiber optic transceiver module 10 is a SFF transceiver module such that SFF requirements are met in addition to having BIT functionality. As seen in FIG. 1, optical source 12, such as a vertical cavity surface emitting laser (VCSEL), is disposed within housing 14 and emits an optical signal 16 that is propagated along first optical fiber 18. Housed within fiber optic transceiver module 10 is a printed wiring board (PWB) 20 having VCSEL driver circuit 22, optical time domain reflectometer (OTDR) signal processing integrated circuit (IC) 24, processor 26, and post amplifier circuit 28. The components of fiber optic transceiver module 10 are packaged such that SFF requirements are met. For instance, examples of SFF requirements are 2×5, 6 or 7 dual-in-line package (DIP), 0.55"×2.5"×0.35" package dimensions, 3.3 volt power supply, as well as other technical requirements. VCSEL 12 is held on submount 30 and is controlled by driver circuit 22, which may be an ASIC. However, the optical source 12 may be controlled or activated in many other manners. Alternative optical sources, such as edge emitting laser diode, may also be employed. First optical fiber 18 is generally a short fiber used to couple optical signal 16 from VCSEL 12. First optical fiber 18 is positioned to receive optical signal 16 and transmit the optical signal to second optical fiber 32. Second optical fiber 32 is generally a long fiber (e.g. 1 meter length) and it is used to form a fiber pigtail to couple optical signals into and out of the transceiver module 10. Second optical fiber 32 extends outside of the housing 14 and may be used to carry a portion of optical signal 34 to another transceiver (not shown) in the fiber cable plant of an airplane.

As shown, first optical fiber 18 has angled end 36 that defines an acute angle 38 relative to a longitudinal axis of the first optical fiber. Similarly, second optical fiber 32 has angled end 40 that defines an acute angle 42 relative to a longitudinal axis of the second optical fiber. The angled ends 36, 40 may be disposed at an angle of between approximately 40 degrees and 60 degrees relative to the longitudinal axis of their corresponding optical fiber. As seen in FIG. 1, the angled end 36 of first optical fiber 18 is aligned to be substantially parallel with the angled end 40 of second optical fiber 32. In this example, the acute angle 38 for the first optical fiber 18 and the acute angle 42 for the second optical fiber 32 may be the same. For example, the acute angle 38 for the angled end 36 of first optical fiber 18 and the acute angle 42 for the angled end 40 of the second optical fiber 32 may both be approximately 49 degrees.

The acute angle 38 of the angled end 36 of the first optical fiber 18 is selected to cause a predefined portion of optical signal 16 emitted from VCSEL 12 to be received at and propagated along second optical fiber 32. Angled end 36 of first optical fiber 18 splits the optical signal 16 such that approximately fifty percent of the optical signal coupled from VCSEL 12 passes from first optical fiber 18 is received at second optical fiber 32, when an angle of approximately 49 degrees is employed. A portion of optical signal 34 is then carried along the second optical fiber 32, which may be connected externally to another transceiver (not shown) through the fiber optic cable plant. Second optical fiber 32 may exit the housing, for example, through a hermetically sealed feed-through, or by connectorization. If there is a discontinuity in the optical path of the second optical fiber (such as a break), a reflected return optical signal 46 returns to the angled end 40 of the second optical fiber 32. Optical detector 52 receives the return optical signal 54 reflected by the angled end 40 of the second optical fiber 32, this reflected signal is from a discontinuity in the optical path of the second optical fiber 32. When employing a 49 degree interface, approximately fifty percent of the return optical signal 46 is reflected from the angled end 40 of the second optical fiber 32 to the optical detector 52.

Figure 2:
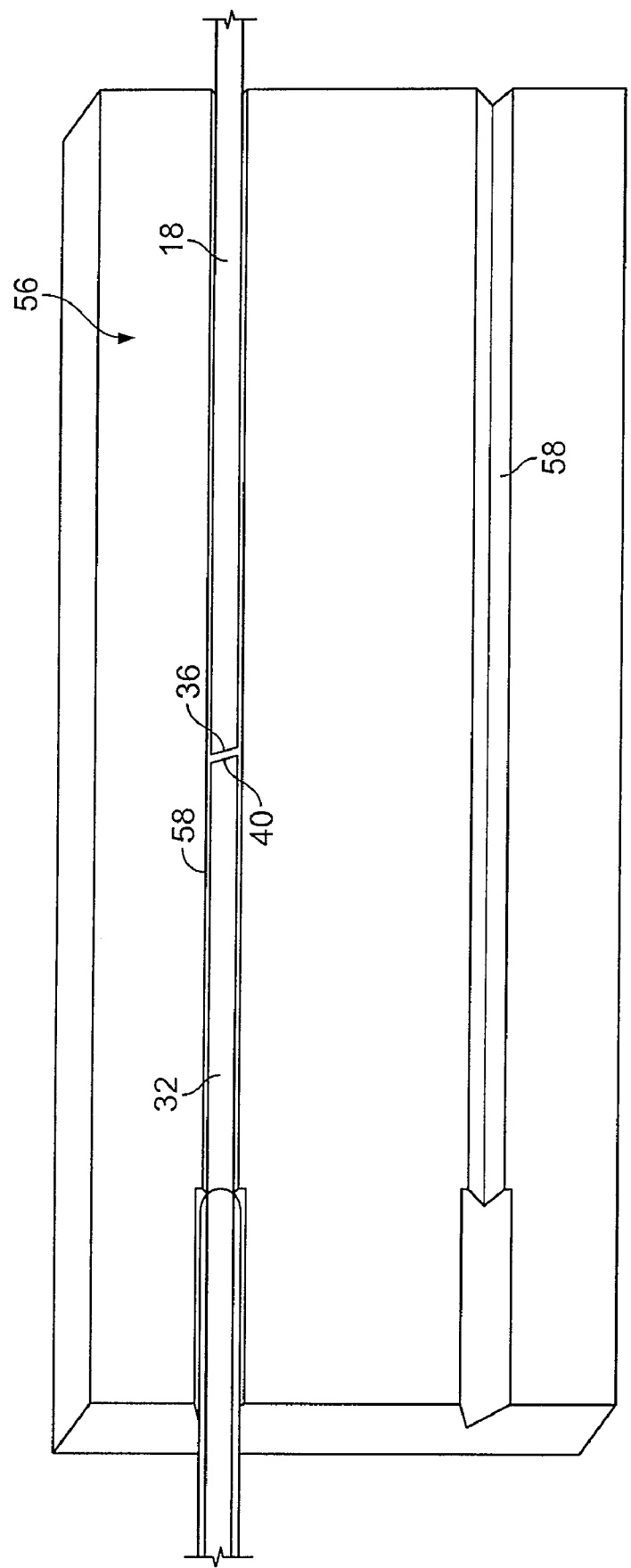
FIG. 2 illustrates a perspective view of a coupler holding and aligning first and second optical fibers of a fiber optic transceiver module with BIT capabilities.

Referring to FIG. 2, coupler 56 embeds and aligns the two optical fibers 18, 32. Coupler 56 may be formed of a silicon material. Formed within coupler 56 is groove 58 that may, for instance be V-shaped to hold and align the ends 36, 40 of the first and second optical fibers 18, 32. The optical fibers, for instance, may be 100/140 micron multi-mode (MM) optical fibers embedded in V-shaped groove 58 of silicon coupler 56. However, other types of optical fibers may selectively be employed. When the two embedded angled fibers in groove 58 split the optical power equally, the completed structure may be called a 3 dB silicon V-groove coupler. In this example, a 3 dB coupler is a miniaturized 3 dB coupler which allows the BIT transceiver module to be fabricated under the small dimensional requirements of a SFF transceiver. The silicon coupler 56 has a short fiber section holding first optical fiber 18 coupling directly to VCSEL 12 and a long section holding angled end 40 of the long second optical fiber 32 that forms the pigtail of the transceiver. The pair of optical fibers 18 and 32 have their respective angled ends 36, 40 aligned in mating relationship forming an angled interface within the V-shaped groove 58 of the coupler 56. In one example, the coating of the shorter first optical fiber 18 may be removed, with the first optical fiber embedded in the V-shaped groove 58. The coating of the second optical fiber 32 may also be stripped from the area proximate the angled end 40. To provide strain relief for the second optical fiber 32, the V-shaped groove 58 of the coupler 56 may include a region having a wider opening for embedding the coated section of the longer second optical fiber 32. An epoxy may be used to hold the optical fibers 18, 32 embedded in the V-shaped groove 58. A portion of the second optical fiber 32 may extend outward from the end of V-shaped groove 58 to the outside of housing 14 to form the fiber pigtail of the BIT transceiver.

Referring again to FIG. 1, if there is a discontinuity in the second optical fiber 32 or the fiber segments that are connected to it (the discontinuity is not shown in the figures), a reflected return optical signal 46 returns to the angled end 40 of the second optical fiber. A portion of the return optical signal 46 is reflected on to the optical detector 52. For instance, in the example where an angled end 40 of approximately 49 degrees is employed for second optical fiber 32, approximately fifty percent of the return optical signal 46 is reflected from the angled end 40 of second optical fiber to optical detector 52. Optical detector 52 may comprise a photodetector, such as a p-type-intrinsic-n-type (PIN) photodiode, an avalanche photodiode, or any other suitable photo detector known to those skilled in the art. In the example shown in FIG. 1, optical detector 52 has lens 60 for focusing the reflected return optical signal 54 on to PIN detector 62 that is coupled with transimpedance amplifier (TIA) integrated circuit (IC) 64. In this example, optical signal 54 is a portion of the return optical signal 46 reflected by angled end 40 of second optical fiber 32 onto the optical detector 52 which has its optical axis 63 positioned at approximately 90 degrees to the silicon V-groove 58 surface (see FIG. 2) of the silicon coupler 56. This positioning of approximately 90 degrees in relation to the return optical signal 46 allows the optical detector 52 to be easily aligned to detect the reflected signal from the discontinuity or breaks in the optical fibers located in the cable plant. Optical detector 52 may be mounted on a submount 66 (the combination of the optical detector 52 with photodiode 62, TIA 64 and the submount 66 may be referred to as a receiver optical subassembly) to aid in alignment of the optical detector to the reflected signal 54.

Return optical signal 54 reflected by the discontinuity is received by the optical detector 52. The optical detector 52 provides an output representative of the received signal. The TIA 64 functions as a pre-amplifier of the detected reflected return optical signal 54. The (differential) electrical outputs associated with the TIA 64 are coupled to post amplifier circuit 28 on the transceiver printed wiring board (PWB) 20 using, for example, coax cable or high bandwidth flexible (flex) circuit 68. The differential electrical outputs of the post amplifier circuit 28 are connected to the Rx+ and Rx− pins 70 of the PWB 20. The electrical output of the optical detector 52 is transmitted via the post amplifier circuit 28 to the OTDR IC 24. The OTDR IC 24 may comprise an application specific integrated circuit (ASIC) or a field programmable gate array (FPGA). Either an ASIC or a FPGA will occupy only small dimensions in PWB 20 of the BIT transceiver module 10.

The OTDR IC 24 analyzes the signal from the optical detector 52 to determine the location of the discontinuity along the optical path of second optical fiber 32. The OTDR IC 24, in response to receipt of the output from the optical detector 52, determines an elapsed time between emission of the optical signal 16 and receipt of the return optical signal 54. For example, a narrow electrical pulse is applied at transmitter inputs (Tx+ and Tx−) 72 coupled with VCSEL driver circuit 22. VCSEL 12 generates optical signal 16, which propagates along first optical fiber 18 with a portion of the signal carried along second optical fiber 32.

In the example seen in FIG. 1, OTDR IC 24, VCSEL driver circuit 22, processor 20 and post amplifier circuit 28 are mounted on the PWB 20 of the fiber optic transceiver module 10. Processor 26 is coupled with OTDR IC 24 and may be employed for sending an electrical signal output 74 to a remote computer (not shown). Processor 26 is the interface between the fiber optic transceiver module 10 and the flight control (or avionics) computer of the airplane. Processor 26 reports the location of the fiber damage that has been detected by the OTDR IC 24. At the command of the remote flight control computer, processor 26 directs the BIT transceiver to perform either fiber fault detection functions or perform normal data communication operations. Processor 26 may also be equipped with software programs to perform self diagnostics on various components of the fiber optic transceiver module. Therefore, after the BIT capability is incorporated, processor 26 has the overall capability to monitor the health of the fiber optic link in the avionics network of an airplane.

The OTDR IC 24, coupled with processor 26 and VCSEL driver circuit 22, determines the time difference ($t_d$) between the optical pulse signals 16 (transmitted by VCSEL 12) and the optical signal pulse 54 detected by detector 52. The speed of the light pulse in the optical fiber is equal to the speed of light in free space, c, divided by the fiber index of reflection, $n_f$, (or group index), both are know physical parameters, $t_d$ is the round trip travel time of the optical pulse from the VCSEL 12 to the discontinuity of the fibers in the optical path of 46. Where c is approximately equal to $3 \times 10^8$ meters/second, $n_f$ is approximately 1.48 in the optical fiber. The location of the discontinuity from the BIT fiber optic transceiver module is determined by OTDR IC 24 as $(t_d \times c)/(2 \times n_f)$. Knowing the approximate location of the discontinuity allows maintenance personnel to quickly access and repair or replace the damaged optical fiber. If the optical detector does not receive an unexpected reflected pulse within a predefined time period, then there is likely no damage within the optical fiber.

Figure 3:
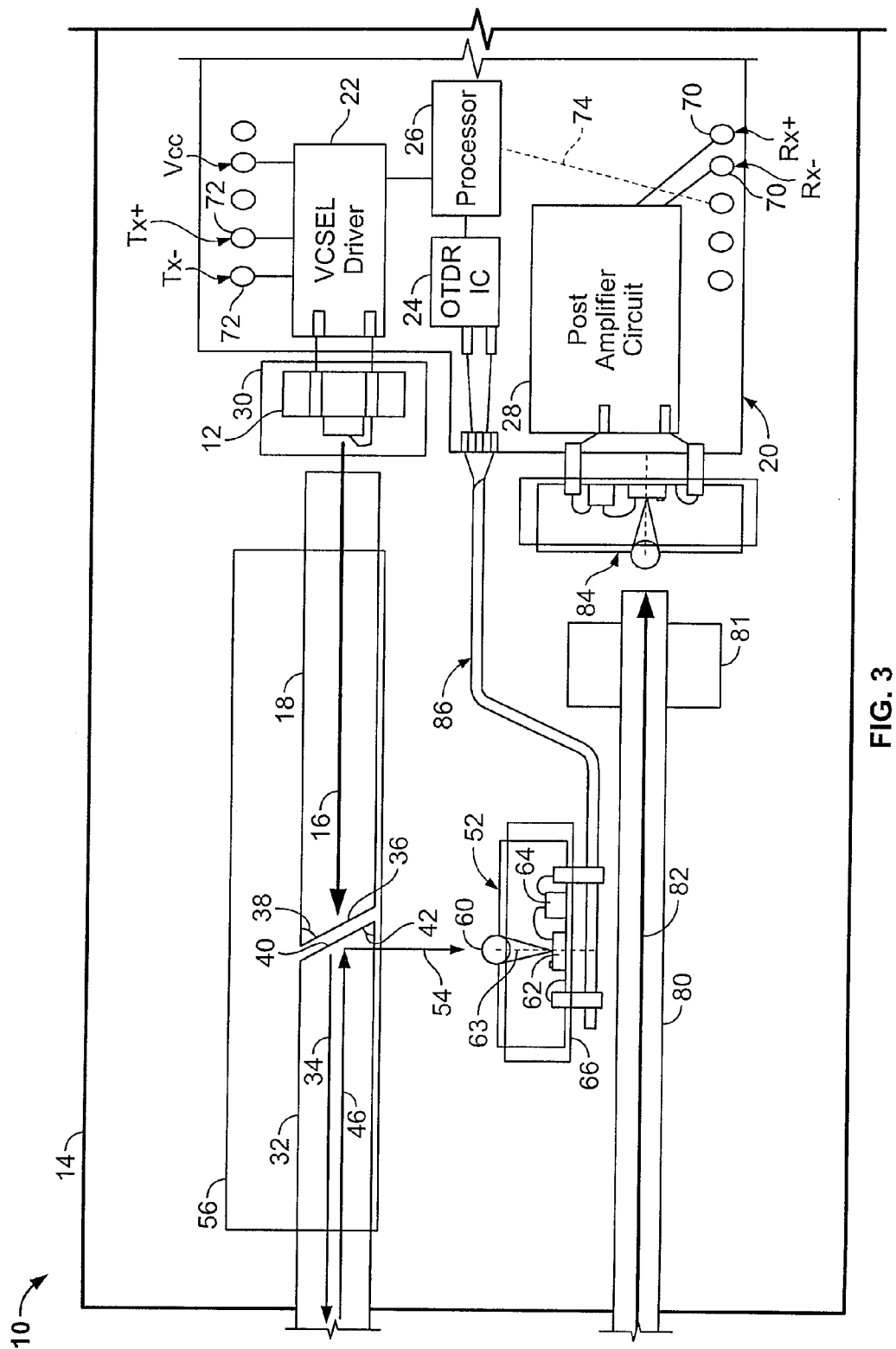
FIG. 3 is a system diagram illustrating an alternative example of a SFF fiber optic transceiver module having BIT capabilities with two fibers, with one fiber transmitting and another fiber receiving optical communication signals.

Referring to FIG. 3, an alternative example of a SFF fiber optic transceiver module 10 is shown. Certain platforms may use duplex fiber optic networks with fiber optic transceiver modules using separate optical fibers for the transmission and the receiving of optical signals. In the embodiment seen in FIG. 3, optical fibers 18 and 32 act as a transmission optical fiber and another optical fiber 80 is employed which acts as a separate receive optical fiber. The receive optical fiber 80, positioned on fiber locking pedestal 81, propagates a receive optical signal 82 received from a corresponding transmitter of a fiber optic transceiver (not shown) of a remote fiber optic network node. In this example, a receiver optical detector 84 (such as another PIN detector coupled with a transimpedance amplifier) is added to the fiber optic transceiver module 10 with receiver optical detector 84 coupled with post amplifier circuit 28. To conserve space for the receive optical fiber 80 and the additional receiver optical detector 84, the optical detector 52 is coupled to OTDR IC 24 in the PWB 20 by a thin high bandwidth flexible optical ribbon cable 86. The process for detecting discontinuities in the optical path of second optical fiber 32 is similar to the operation as set forth in FIG. 1. In the configuration of FIG. 3, receiver optical detector 84 is connected to post amplifier circuit 28, and optical fiber 18, 32 transmit optical signal from VCSEL 12. Detection of discontinuities in the cable plant is made upon receipt of the return optical signal to optical detector 52 coupled by flex circuit 86 to OTDR IC 24, in the example seen in FIG. 3.

The foregoing description of the preferred embodiments of the invention have been presented for purposes of illustration and description, and are not intended to be exhaustive or to limit the invention the precise forms disclosed. The descriptions were selected to best explain the principles of the invention and their practical application to enable others skilled in the art to best utilize the invention in various embodiments and various modifications as are suited to the particular use contemplated. It is intended that the scope of the invention not be limited by the specification, but be defined by the claims set forth below.

What is claimed is:

1. A fiber optic transceiver module having built-in test capabilities comprising:
    a first optical fiber having an angled end that defines an acute angle relative to a longitudinal axis of the first optical fiber;
    a second optical fiber having an angled end that defines an acute angle relative to a longitudinal axis of the second optical fiber, the first optical fiber and the second optical fiber being aligned with one another, wherein the acute angle for the angled end of the first optical fiber and the acute angle for the angled end of the second optical fiber are both 49 degrees;
    an optical source that emits an optical signal propagated along the first optical fiber in which a portion of the optical signal is received at the second optical fiber and is propagated along the second optical fiber wherein the acute angle of the angled end of the first optical fiber is selected to cause a predefined portion of the optical signal entitled from the optical source to be received at and propagated along the second optical fiber such that approximately 50% of the optical signal coupled from the optical source is passed from the first optical fiber to the second optical fiber; and an optical detector for receiving a return optical signal through the angled end of the second optical fiber in response to reflection from a discontinuity in an optical path of the second optical fiber, said fiber optic transceiver module having built-in test capabilities detects discontinuities in the optical path of the second optical fiber and meets small-form-factor requirements.

2. The fiber optic transceiver module of claim 1, wherein the angled end of the first optical fiber is aligned to be substantially parallel with the angled end of the second optical fiber.

3. The fiber optic transceiver module of claim 1, wherein approximately 50 percent of the return optical signal is reflected from the angled end of the second optical fiber to the optical detector.

4. The fiber optic transceiver module of claim 1, further comprising a coupler having a groove that holds and aligns the first optical fiber and the second optical fiber.

5. The fiber optic transceiver module of claim 4, wherein the coupler is formed of silicon material and the groove is V-shaped.

6. The fiber optic transceiver module of claim 1, wherein the optical source comprises a vertical cavity surface emitting laser.

7. The fiber optic transceiver module of claim 6, wherein the optical detector comprises a p-type-intrinsic-n-type (PIN) detector coupled with a transimpedance amplifier circuit.

8. The fiber optic transceiver module of claim 6, further comprising an optical time domain reflectometer (OTDR) integrated circuit (IC), responsive to the optical detector, for determining an elapsed time between emission of the optical signal and receipt of the return optical signal.

9. The fiber optic transceiver of module of claim 8, wherein the OTDR IC is capable of determining a location of the discontinuity along the optical path of the second optical fiber based on the elapsed time.

10. The fiber optic transceiver module of claim 8, further comprising a processor coupled with the OTDR IC for sending electrical signal output to a remote computer.

11. The fiber optic transceiver module of claim 10, wherein the OTDR IC, a driver circuit of the vertical cavity surface emitting laser, and the processor are mounted on a printed wiring board of the fiber optic transceiver module.

12. The fiber optic transceiver module of claim 1, further comprising a separate receive optical fiber for propagating optical signals received from a transmitter in a remote fiber optic network node.

13. A method for detecting discontinuities in a fiber optic transceiver module having built-in test capabilities, comprising:

emitting an optical signal propagated along a first optical fiber having an angled end that defines an acute angle relative to a longitudinal axis of the first optical fiber, such that a portion of the optical signal is received at and propagated along second optical fiber, the second optical fiber having an angled end that defines an acute angle relative to a longitudinal axis of the second optical fiber;

aligning the angled end of the first optical fiber with the angled end of the second optical fiber; and receiving a return optical signal through the angled end of the second optical fiber by an optical detector in response to reflection from a discontinuity in an optical path of the second optical fiber, said fiber optic transceiver module having built-in-test capabilities detects discontinuities in the optical path of the second optical fiber and meets small-form-factor requirements, and wherein the acute angle of the angled end of the first optical fiber is selected to cause a predefined portion of the optical signal emitted from the optical source to be received at and propagated along the second optical fiber such that approximately 50% of the optical signal coupled from the optical source is passed from the first optical fiber to the second optical fiber.

14. The method of claim 13, wherein the acute angle for the angled end of the first optical fiber and the acute angle for the angled end of the second optical fiber are both between 40 degrees and 60 degrees.

15. The method of claim 14, further comprising aligning the angled end of the first optical fiber to be substantially parallel with the angled end of the second optical fiber.

16. The method of claim 13, wherein the acute angle for both the angled end of the first optical fiber and the acute angle for the angled end of the second optical fiber is approximately 49 degrees.

17. The method of claim 13, further comprising positioning the angled end of the first optical fiber and the angled end of the second optical fiber in a V-shaped groove of a coupler formed of silicon material.

18. The method of claim 13, further comprising determining an elapsed time between emission of the optical signal and receipt of the return optical signal, such that a location of the discontinuity along the optical path of the second optical fiber may be determined.

19. The method of claim 18, further comprising mounting a post amplifier circuit, an optical time domain reflectometer (OTDR) IC, a processor, and a driving circuit for a vertical cavity surface emitting laser on a printed wiring board of the fiber optic transceiver module.

20. The method of claim 13, further comprising employing a separate receive optical fiber for propagating optical signals received from a transmitter in a remote fiber optic network node.

21. A fiber optic transceiver module having built-in test capabilities comprising:

a first optical fiber having an angled end that defines an acute angle relative to a longitudinal axis of the first optical fiber;

a second optical fiber having an angled end that defines an acute angle relative to a longitudinal axis of the second optical fiber, the first optical fiber and the second optical fiber being aligned with one another;

a coupler having a groove that holds and aligns the first optical fiber and the second optical fiber, wherein the coupler is formed of silicon material and the groove is V-shaped;

an optical source that emits an optical signal propagated along the first optical fiber in which a portion of the optical signal is received at the second optical fiber and is propagated along the second optical fiber wherein the acute angle of the angled end of the first optical fiber is selected to cause a predefined portion of the optical signal entitled from the optical source to be received at and propagated along the second optical fiber such that approximately 50% of the optical signal coupled from the optical source is passed from the first optical fiber to the second optical fiber; and an optical detector for receiving a return optical signal through the angled end of the second optical fiber in response to reflection from a discontinuity in an optical path of the second optical fiber, said fiber optic transceiver module having built-in test capabilities detects discontinuities in the optical path of the second optical fiber and meets small-form-factor requirements.

22. The fiber optic transceiver module of claim 21, wherein the acute angle for the angled end of the first optical fiber and the acute angle for the angled end of the second optical fiber are both between 40 degrees and 60 degrees.

23. The fiber optic transceiver module of claim 22, wherein the angled end of the first optical fiber is aligned to be substantially parallel with the angled end of the second optical fiber.

24. The fiber optic transceiver module of claim 22, wherein the acute angle for the first optical fiber and the acute angle for the second optical fiber are substantially the same.

25. The fiber optic transceiver module of claim 24, wherein the acute angle for the angled end of the first optical fiber and the acute angle for the angled end of the second optical fiber are both 49 degrees.

26. The fiber optic transceiver module of claim 21, wherein approximately 50 percent of the return optical signal is reflected from the angled end of the second optical fiber to the optical detector.

27. The fiber optic transceiver module of claim 21, wherein the optical source comprises a vertical cavity surface emitting laser.

28. The fiber optic transceiver module of claim 27, wherein the optical detector comprises a p-type-intrinsic-n-type (PIN) detector coupled with a transimpedance amplifier circuit.

29. The fiber optic transceiver module of claim 27, further comprising an optical time domain reflectometer (OTDR) integrated circuit (IC), responsive to the optical detector, for determining an elapsed time between emission of the optical signal and receipt of the return optical signal.

30. The fiber optic transceiver of module of claim 29, wherein the OTDR IC is capable of determining a location of the discontinuity along the optical path of the second optical fiber based on the elapsed time.

31. The fiber optic transceiver module of claim 29, further comprising a processor coupled with the OTDR IC for sending electrical signal output to a remote computer.

32. The fiber optic transceiver module of claim 31, wherein the OTDR IC, a driver circuit of the vertical cavity surface emitting laser, and the processor are mounted on a printed wiring board of the fiber optic transceiver module.

33. The fiber optic transceiver module of claim 21, further comprising a separate receive optical fiber for propagating optical signals received from a transmitter in a remote fiber optic network node.

34. A fiber optic transceiver module having built-in test capabilities comprising:
 a first optical fiber having an angled end that defines an acute angle relative to a longitudinal axis of the first optical fiber;
 a second optical fiber having an angled end that defines an acute angle relative to a longitudinal axis of the second optical fiber, the first optical fiber and the second optical fiber being aligned with one another;
 an optical source that emits an optical signal propagated along the first optical fiber in which a portion of the optical signal is received at the second optical fiber and is propagated along the second optical fiber wherein the acute angle of the angled end of the first optical fiber is selected to cause a predefined portion of the optical signal entitled from the optical source to be received at and propagated along the second optical fiber such that approximately 50% of the optical signal coupled from the optical source is passed from the first optical fiber to the second optical fiber, wherein the optical source comprises a vertical cavity surface emitting laser;
 an optical detector for receiving a return optical signal through the angled end of the second optical fiber in response to reflection from a discontinuity in an optical path of the second optical fiber, said fiber optic transceiver module having built-in test capabilities detects discontinuities in the optical path of the second optical fiber and meets small-form-factor requirements; and
 an optical time domain reflectometer (OTDR) integrated circuit (IC), responsive to the optical detector, for determining an elapsed time between emission of the optical signal and receipt of the return optical signal.

35. The fiber optic transceiver module of claim 34, wherein the acute angle for the angled end of the first optical fiber and the acute angle for the angled end of the second optical fiber are both between 40 degrees and 60 degrees.

36. The fiber optic transceiver module of claim 35, wherein the angled end of the first optical fiber is aligned to be substantially parallel with the angled end of the second optical fiber.

37. The fiber optic transceiver module of claim 35, wherein the acute angle for the first optical fiber and the acute angle for the second optical fiber are substantially the same.

38. The fiber optic transceiver module of claim 37, wherein the acute angle for the angled end of the first optical fiber and the acute angle for the angled end of the second optical fiber are both 49 degrees.

39. The fiber optic transceiver module of claim 34, wherein approximately 50 percent of the return optical signal is reflected from the angled end of the second optical fiber to the optical detector.

40. The fiber optic transceiver module of claim 34, further comprising a coupler having a groove that holds and aligns the first optical fiber and the second optical fiber.

41. The fiber optic transceiver module of claim 40, wherein the coupler is formed of silicon material and the groove is V-shaped.

42. The fiber optic transceiver module of claim 34, wherein the optical detector comprises a p-type-intrinsic-n-type (PIN) detector coupled with a transimpedance amplifier circuit.

43. The fiber optic transceiver of module of claim 34, wherein the OTDR IC is capable of determining a location of the discontinuity along the optical path of the second optical fiber based on the elapsed time.

44. The fiber optic transceiver module of claim 34, further comprising a processor coupled with the OTDR IC for sending electrical signal output to a remote computer.

45. The fiber optic transceiver module of claim 44, wherein the OTDR IC, a driver circuit of the vertical cavity surface emitting laser, and the processor are mounted on a printed wiring board of the fiber optic transceiver module.

46. The fiber optic transceiver module of claim 34, further comprising a separate receive optical fiber for propagating optical signals received from a transmitter in a remote fiber optic network node.

* * * * *